(12) United States Patent
Leber et al.

(10) Patent No.: US 12,090,933 B2
(45) Date of Patent: Sep. 17, 2024

(54) DECORATIVE COMPOSITE BODY

(71) Applicant: D. Swarovski KG, Wattens (AT)

(72) Inventors: Annemarie Leber, Fügen (AT); Jan Woerdenweber, Innsbruck (AT); Cornelius Magerl, Hall in Tirol (AT); Dennis Nissen, Wattenberg (AT)

(73) Assignee: D. Swarovski KG, Wattens (AT)

( * ) Notice: Subject to any disclaimer, the term of this patent is extended or adjusted under 35 U.S.C. 154(b) by 1010 days.

(21) Appl. No.: 16/967,893

(22) PCT Filed: Feb. 12, 2019

(86) PCT No.: PCT/EP2019/053457
§ 371 (c)(1),
(2) Date: Aug. 6, 2020

(87) PCT Pub. No.: WO2019/158535
PCT Pub. Date: Aug. 22, 2019

(65) Prior Publication Data
US 2021/0024017 A1  Jan. 28, 2021

(30) Foreign Application Priority Data
Feb. 13, 2018 (EP) .................................. 18156544

(51) Int. Cl.
*B60R 16/00* (2006.01)
*A44C 17/00* (2006.01)
*B60K 35/10* (2024.01)
*H03K 17/96* (2006.01)

(52) U.S. Cl.
CPC .......... *B60R 16/005* (2013.01); *A44C 17/001* (2013.01); *B60K 35/10* (2024.01);
(Continued)

(58) Field of Classification Search
CPC .......... Y02E 10/52; G06F 2203/04103; G06F 3/044; G06F 3/0443; G06F 3/0446;
(Continued)

(56) References Cited

U.S. PATENT DOCUMENTS 7,589,292 B2 * 9/2009 Jung ...................... H01H 13/83
                                                              200/314
9,310,030 B2 * 4/2016 Tong ....................... F21K 9/232
(Continued)

FOREIGN PATENT DOCUMENTS

CN       102378957 A       3/2012
CN       105034969 A       11/2015
(Continued)

OTHER PUBLICATIONS

Extended European Search Report; European Application No. 1815644. 1; Jul. 11, 2018; European Patent Office; Munich, Germany.
(Continued)

*Primary Examiner* — Anthony R Jimenez
(74) *Attorney, Agent, or Firm* — Stevens & Showalter LLP (57) ABSTRACT

A decorative element comprising a faceted transparent body having a front surface and a back surface, and a coating on at least part of the back surface of the faceted transparent body. The coating comprises a reflective layer of semiconductor material and a layer of lacquer over the reflective layer, and the reflective layer of semiconductor material has a thickness of at least about 400 nm or at least about 250 nm. Methods of making a decorative element, uses of the decorative element, a switch cover comprising the decorative element, and a switch comprising a sensor for detecting actuation of the switch and a cover protecting the sensor and comprising the decorative element are also described.

19 Claims, 5 Drawing Sheets

(52) U.S. Cl.
CPC .... *H03K 17/962* (2013.01); *B60K 2360/1446* (2024.01); *B60K 2360/23* (2024.01); *B60K 2360/688* (2024.01); *H03K 2217/96015* (2013.01); *H03K 2217/96042* (2013.01)

(58) Field of Classification Search
CPC ............ G06F 3/04883; H01L 31/0224; H01L 31/054; H01L 31/022441; H01L 31/022466; H01L 31/022475; H01L 31/022483; H01L 31/042; H01L 31/0543; H01L 31/0549; H01L 31/055; H01L 31/1884; H03K 17/96; H03K 17/962; H03K 2217/96015; H03K 2217/96042; H02S 99/00; A44C 15/00; A44C 15/0015; A44C 17/001; A44C 17/00; B60K 2370/1446; B60K 2370/688; B60K 2370/23; B60K 37/06; B60K 35/10; B60R 16/00
See application file for complete search history.

(56) References Cited

U.S. PATENT DOCUMENTS

2008/0212189 A1* 9/2008 Baur .................. B32B 17/1022
362/540

2009/0230568 A1* 9/2009 Yasuda .................. H01L 24/83
525/119
2016/0237324 A1* 8/2016 Jang ............................ C09J 7/38
2019/0008242 A1* 1/2019 Gapp .................. H03K 17/962

FOREIGN PATENT DOCUMENTS

| EP | 1725502 A1 | 11/2006 |
| EP | 1883855 A2 | 2/2008 |
| EP | 2625149 A1 | 8/2013 |
| EP | 3016150 A1 | 5/2016 |
| EP | 3190631 A1 | 7/2017 |
| WO | 2019158535 A1 | 8/2019 |

OTHER PUBLICATIONS

International Search Report and Written Opinion of the International Searching Authority; International Application No. PCT/EP2019/053457; Apr. 26, 2019; European Patent Office; Rijswijk, Netherlands.

Chinese Office Action dated Dec. 15, 2022; Chinese Application No. 2019800128627; Chinese Intellectual Property Office; Peoples Republic of China.

Chinese Search Report dated Dec. 7, 2022; Chinese Application No. 2019800128627; Chinese Intellectual Property Office; Peoples Republic of China.

* cited by examiner

DECORATIVE COMPOSITE BODY

FIELD OF THE INVENTION

The invention relates to a decorative element, such as a crystal, having an opaque back coating providing uniform reflection of light even when facets are provided on the coated surface. The decorative element is suitable for use as a decorative and protective cover for a switch, for example a pressure switch or a capacitive touch sensitive switch.

INTRODUCTION

To date, gemstones have been employed almost exclusively for purely aesthetic purposes in accessories and on textiles, with no regard to a functional effect. It would be desirable to be able to use gemstones, such as crystals, in a functional context, for example, as part of a switch, without losing the functionality of the switch. Particularly in the field of luxury cars, multiple switches may be provided on the dashboard, central console, etc. and the aesthetic plays a very important part in the attractiveness of the vehicle to a consumer.

In this context, it would be advantageous if a gemstone such as a crystal could be used to replace a cover element of a switch, which are typically made of a plastic material.

One of the challenges associated with the use of a crystal or gemstone to form part of a switch or other control element is that a switch or other control element may have a complex shape, and the crystal or gemstone may be faceted for enhanced appearance. In such a context, applying dielectric layers to the back surface of a crystal to reflect incident light can be problematic because their reflectiveness depends on maintaining a uniform thickness over the whole back surface of the crystal. This is difficult to achieve when the back surface of the crystal or gemstone has a complex topology. Another way to obtain a reflective layer is by applying metallic coatings (e.g. silver) but this has other drawbacks such as compatibility with capacitive sensors.

Further, decorative elements to be integrated in switches may have additional requirements over those that are simply applied to fashion items. In particular, their presence must not hinder the functionality of the switch. Additionally, they must be able to perform all of the functions that a conventional plastic switch cover performs. For example, they must function as an element that can be actuated (the manner of actuation depending on the type of switch), that can hide any functional elements of the switch located behind the cover, and that can bear indicia to enable a user to identify the switch.

It is against this background that the invention has been devised.

SUMMARY OF THE INVENTION

In a first aspect, the invention resides in a decorative element comprising a faceted transparent body having a front surface and a back surface, and a coating on at least a part of the back surface of the faceted transparent body, wherein the coating comprises a reflective layer of semiconductor material, wherein the reflective layer of semiconductor material has a thickness of at least about 250 nm, at least about 300 nm, at least about 350 nm or at least about 400 nm.

By virtue of the presence of the semiconductor reflective layer of at least about 250 nm or at least about 400 nm, a coating is obtained which is opaque and exhibits a uniform reflection of light over the whole coated surface. The benefits of the invention are achieved even when the coating is applied to a faceted or contoured side of a decorative element despite that the facets or contours may result in an uneven thickness of the reflective layer.

In embodiments, a protective cover or layer is applied over the semiconductor reflective layer to protect it from damage. A suitable protective layer is a lacquer layer. The protective layer, such as a lacquer layer, may additionally provide a suitable surface for enhancing adhesion or for receiving an adhesive to allow the decorative element to be attached or adhered to a surface, such as a switch or other control element. Further, the lacquer layer may contribute to the opacity and colour of the coating.

Thus, the faceted transparent body and lacquer (or other protective layer) protect the reflective layer and the faceted transparent body provides an aesthetically pleasing front surface to the switch or control element. In some embodiments, the back surface of the decorative element, such as a crystal or gemstone may be facetted on the back surface and may be flat (or smoothly contoured) on the front surface. In some embodiments, the back surface of the decorative element may be smoothly contoured and may be facetted on the front surface. In some embodiments, the back surface of the decorative element may be facetted on the back surface and may also be facetted on the front surface.

In embodiments, the reflective layer of semiconductor material has a thickness of at least about 500 nm.

In embodiments, the reflective layer comprises Si or Ge. Suitably, the lacquer may be a polyurethane lacquer. In embodiments, the reflective layer consists of Si, and the lacquer is a polyurethane lacquer. In embodiments, the lacquer is a bi-component polyurethane lacquer.

According to a second aspect of the invention, there is provided a decorative element comprising a faceted transparent body having a front surface and a back surface, and a coating on at least part of the back surface of the faceted transparent body, wherein the coating comprises a reflective layer of semiconductor material and a layer of lacquer over the reflective layer, wherein the semiconductor material comprises Si as a major component and wherein the reflective layer of semiconductor material has a thickness of at least about 400 nm.

According to a third aspect of the invention, there is provided a decorative element comprising a faceted transparent body having a front surface and a back surface, and a coating on at least part of the back surface of the faceted transparent body, wherein the coating comprises a reflective layer of semiconductor material and a layer of lacquer over the reflective layer, wherein the semiconductor material comprises Ge as a major component and wherein the reflective layer of semiconductor material has a thickness of at least about 250 nm.

In embodiments, of the first or third aspect of the invention, the semiconductor material comprises at least 50 wt % Ge, at least 70 wt % Ge, or at least 90 wt % Ge.

In embodiments of any of the first, second and third aspects of the invention, the reflective layer is applied by physical vapour deposition.

In embodiments, the transparent body has a transparency that is higher than zero.

In embodiments, the reflective layer is applied directly to the back surface of the faceted transparent body and the lacquer layer is applied over the reflective layer.

In embodiments, the coating consists of a reflective layer of semiconductor material and a layer of lacquer.

In embodiments, the reflective layer has a non-uniform thickness and the visible light reflection spectrum of the reflective layer does not substantially change depending on the thickness of the reflective layer. In embodiments, the visible light reflection spectrum of the reflective layer, as perceived by the human eye, does not substantially change depending on the thickness of the reflective layer. In embodiments, the visible light reflection spectrum is the percentage of light reflected between 350 and 650 nm. In embodiments, the reflective layer does not show a visible variation in colour as perceived by the human eye, depending on the thickness of the reflective layer.

In embodiments, the faceted transparent body comprises a non-planar back surface. In some such embodiments, the back surface of the faceted transparent body comprises facets.

In embodiments, the faceted transparent body comprises facets on the surface that supports the coating. In embodiments, the reflective layer has a thickness of at least 500 nm, at least 600 nm, at least 800 nm, or at least 1,000 nm. In embodiments, the reflective layer has a thickness of at most 2,000 nm, at most 1,500 nm, at most 1,200 nm, at most 1,000 nm, or at most 800 nm. Suitably, the reflective layer may have a thickness of between 250 nm and 1,500 nm, between 400 and 1,500 nm, between 500 nm and 1,500 nm, between 600 and 1,500 nm or between 800 and 1,500 nm.

In embodiments, the reflective layer comprises silicon or germanium. For example, the reflective layer may consist of silicon or germanium. Alternatively, the reflective layer may comprise silicon and/or germanium as major element(s) and the silicon and/or germanium layer may be doped with one or more metals.

In embodiments, the reflective layer comprises silicon and/or germanium doped with aluminium. For example, the reflective layer may comprise up to 5 wt % of aluminium. Suitably, the reflect layer may comprise silicon and up to 5 wt % of aluminium.

In embodiments, the reflective layer is applied by physical vapour deposition. In embodiments, the reflective layer is applied by magnetron sputtering.

In embodiments, the reflective layer has low conductivity at room temperature. In embodiments, the faceted transparent body is made of one or more materials with low conductivity; wherein the low conductivity is: less than about 3 S/m at 20° C., less than about 2.5 S/m at 20° C., less than about 2.2 S/m at 20° C., less than about 2.0 S/m at 20° C., or less than about 1.6 S/m at 20° C. For example, the reflective layer may have a conductivity that is not substantially higher than that of Germanium at room temperature.

In embodiments, the faceted transparent body does not comprise a material that has high conductivity at room temperature. In embodiments, the faceted transparent body is made of one or more materials with low conductivity.

In embodiments, the decorative element does not comprise a material that has high conductivity at room temperature. In embodiments, the decorative element does not comprise a material that has a conductivity that is substantially higher than that of Germanium at room temperature.

In embodiments, the coating does not comprise a material that has high conductivity at room temperature. In embodiments, the coating does not comprise a material that has a conductivity that is substantially higher than that of Germanium at room temperature.

In embodiments, the faceted transparent body is a transparent plastic body, a cubic zirconia body or a glass body. In embodiments, the faceted transparent body is a crystal body.

In embodiments, the layer of lacquer comprises a lacquer selected from the group consisting of: epoxy lacquers, one component polyurethane lacquers, bi-component polyurethane lacquers, acrylic lacquers, UV-curable lacquers, and sol-gel coatings. The lacquer may optionally be pigmented.

In embodiments, the lacquer is applied by spraying, digital printing, rolling, curtain coating or other two-dimensional application methods known in the art.

In embodiments, the layer of lacquer is a protective layer for the reflective layer.

Suitably, the lacquer may be selected so as to be mechanically and chemically robust and bondable.

In embodiments, a lacquer is mechanically and chemically robust if it would not substantially degrade or allow degradation of the underlying reflective layer in the conditions that would be expected in the intended use. The decorative element may advantageously show high resistance to sweat, anti-corrosion salt spray test and climate tests. In embodiments, the multilayer coating shows no significant alteration when exposed to one or more, and preferably all, of the following tests: temperature change test according to DIN 9022-2, sulfur dioxide (corrosion) test according to DIN 50018-KFW 0,2 S, environmental test according to DIN ISO 9022-2 (cold, heat and humidity) and salt spray test according to DIN EN 60068-2-11 Ka.

In embodiments, the coating is impermeable to light up to about 10,000 cd/m². In embodiments, the coating is impermeable to light such that a human eye at a distance of about 30 cm from the back coated sample cannot detect the presence of light up to about 10,000 cd/m² behind the sample.

In embodiments, the decorative element has: (i) a maximum thickness of about 12 mm, of about 10 mm, or of about 8 mm; and/or (ii) a thickness of between 3 mm and 12 mm, of between 3 mm and 10 mm, of between 4 mm and 10 mm or between 4 mm and 8 mm. Suitably, the decorative element may have a maximum thickness of about 8 mm, about 6 mm, or about 4 mm.

In embodiments, the decorative element has a thickness of between 4 and 10 mm, preferably between 4 and 8 mm, wherein the thickness of the decorative element is the sum of the length between the front surface of the faceted transparent body and the back surface of the transparent body and the thickness of the coating at the corresponding location on the back surface of the faceted transparent body. In embodiments, the decorative element has a variable thickness comprised between 4 and 10 mm.

In embodiments, the decorative element is a cover for a switch or control element. For example, the decorative element may be a cover for a capacitive touch switch. The decorative element may be a cover for a switch which forms part of the dashboard or console of a vehicle, such as a car, yacht or plane.

According to a fourth aspect of the invention, there is provided a method of making a decorative element, the method comprising: providing a faceted transparent body having a front surface and a back surface; and applying a reflective layer of semiconductor material having a thickness of at least about 400 nm or at least about 250 nm on at least part of the back surface of the faceted transparent body.

In embodiments, the method further comprises applying a layer of lacquer on the layer of semiconductor material. The layer of lacquer may be applied, for example, by spraying.

In embodiments, the reflective layer is applied by physical vapour deposition.

In embodiments, the method according to the fourth aspect may be adapted to make a decorative element according to any of the embodiments of the first, second or third aspects According to a fifth aspect, the invention provides the use of a decorative element according to any of the embodiments of the first, second and third aspects of the invention, or a decorative element made according to the method of the fourth aspect, as a cover for a switch or control element.

In embodiments, the use is for a spatially resolved touch sensitive switch. In embodiments, the use is for a capacitive touch sensitive switch.

According to a sixth aspect, the invention provides a switch cover for a switch or control element, comprising a decorative element according to any of the embodiments of the first, second or third aspects, wherein in use the back surface of the faceted transparent body is a back surface of the switch cover and the front surface provides an operator input surface of the switch. In embodiments, a part of the back surface of the faceted transparent body is not covered by the reflective layer, such that a light source placed adjacent the back surface of the faceted transparent body is visible from the side of the decorative element opposite the coated back surface in selected areas corresponding to part of the back surface of the faceted transparent body that is not coated with the reflective layer.

In embodiments, the back surface of the faceted transparent body is the surface that is internal to the assembled switch when the decorative element forms a cover of an assembled switch.

In embodiments, the coating covers part of the back surface of the faceted transparent body such that a light source placed behind the back surface of the faceted transparent body is visible from the side of the decorative element opposite the coated back surface in selected areas corresponding to areas of the back surface of the faceted transparent body that are not coated with the reflective layer.

Embodiments of the present aspect of the invention may comprise any of the features of the first, second or third aspects.

According to a seventh aspect, the invention provides a cover for a switch, the cover comprising a faceted transparent body having a front surface and a back surface, and a coating on at least part of the back surface of the faceted transparent body, wherein the coating comprises a reflective layer of semiconductor material and a layer of lacquer over the reflective layer, and wherein the reflective layer of semiconductor material has a thickness of at least about 400 nm or at least about 250 nm.

Embodiments of the present aspect of the invention may comprise any of the features of the first, second or third aspects.

According to an eight aspect, the invention provides a switch comprising a sensor for detecting actuation of the switch and a cover protecting the sensor and comprising the decorative element of any of the embodiments of the first, second or third aspects, wherein the decorative element is assembled in the switch such that the faceted transparent body forms the external, actuating surface of the switch, and the back surface of the faceted transparent body is internal to the assembled switch.

In embodiments, the faceted side forms an internal side of the switch cover. In embodiments, the faceted transparent body is faceted on the front and back sides.

According to a further aspect, the invention provides a switch comprising a sensor for detecting actuation of the switch and the cover of the sixth or seventh aspect of the invention. The sensor may be a pressure sensor Alternatively, the sensor may be a capacitive sensor and the switch may be a touch sensitive switch.

In embodiments, the sensor is located behind the decorative cover such that it is located behind the coated areas of the decorative element or cover. In such embodiments, the sensor is not visible in use. Suitably, the sensor being not visible in use means that when the switch is assembled, an operator looking at the external surface of the switch would not be able to see the sensor through the decorative element or cover.

In embodiments, the switch comprises a light source located behind the decorative element or cover. In embodiments, the coating on the back surface of the faceted transparent body covers part of the back surface of the faceted transparent body such that the light source placed behind the decorative element or cover is visible from the side of the decorative element or cover opposite the coated back surface in selected areas corresponding to areas of the back surface of the faceted transparent body that are not coated with the reflective layer.

In embodiments, the selected areas through which the light source is visible form one or more indicia.

In embodiments, the switch is for a dashboard or console of a vehicle, such as a car, yacht or plane.

Embodiments of any of the aspects of the invention may comprise any of the features described in relation to any other aspect of the invention, unless such features are clearly not compatible.

BRIEF DESCRIPTION OF THE DRAWINGS

One or more embodiments of the invention will now be described, by way of example only, with reference to the appended drawings, in which:

FIGS. 6A, 6B and 6C show an example of a decorative element according to the invention, wherein the decorative element is configured to be mounted on a gear selector switch of a vehicle, and wherein the approx. thickness of the coating according to the invention in multiple points on the contoured surface of the decorative element has been determined. FIGS. 6A and 6B show schematic representations of the decorative element.

DETAILED DESCRIPTION

The inventors have found that, surprisingly, a crystal or gemstone having a faceted transparent body can be coated with a layer of a semiconductor material, forming an opaque reflective layer with uniform reflective properties despite the layer having a variable thickness across the layer. Furthermore, the inventors have found that such a coated faceted transparent body can be used to replace a cover of a switch or other control element with a superior appearance and without hindering the functionalities of the switch, even when the switch is touch sensitive, as will now be described. In particular, a coated faceted transparent body according to the invention can be used to replace the cover of a switch which has spatially resolved touch function, without losing said the desired functionality.

Throughout this description, the terms 'back, and 'front' surface are used to refer to the surfaces of the decorative element that when incorporated into a component, such as a switch or control element, are intended to face towards an internal surface of the component in which the decorative element is incorporated (back surface) or an external surface of the component (front surface), respectively. However, the skilled person will appreciate that the decorative element may have a complex geometry as required by the circumstances, and as such a back or front surface may, in fact, comprise a collection of jointed or disjointed surfaces. In practice, a front surface is intended to be visible in use, whereas a back surface is intended to be attached or otherwise adhered to an article, such as a switch or control element of a vehicle in use.

Throughout this description, the term 'switch' or 'control element' is used to refer to any kind of actuator including buttons such as, for example, push buttons, sliders, joysticks, rotary actuators, rockers, touch sensitive surfaces of various shapes, and combinations thereof.

Figure 1:
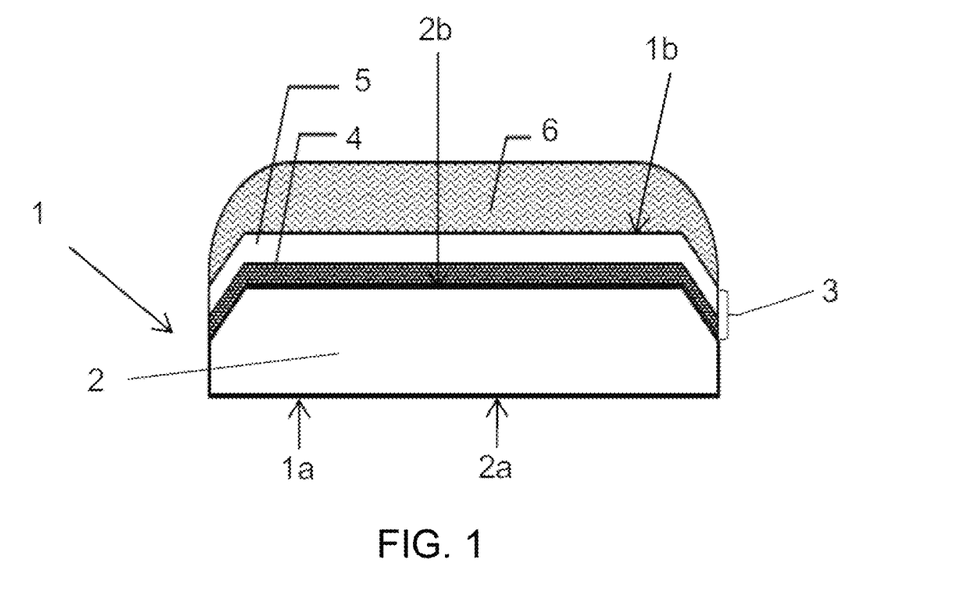
FIG. 1 is a schematic view of a decorative element according to the invention, comprising a faceted transparent body having a front surface and a back surface, and a coating on at least a portion of the back surface of the faceted transparent body. The coating comprises a reflective layer of semiconductor material and a layer of lacquer; the decorative element is shown with a sensor located proximal to the back surface of the decorative element.

FIG. 1 is a schematic view of a decorative element 1 according to the invention. The decorative element 1 comprises a faceted transparent body 2 having a front surface 2a and a back surface 2b. A multilayer coating 3 is provided on at least part of the back surface 2b of the faceted transparent body 2. The multilayer coating 3 comprises a reflective layer 4 of semiconductor material in contact with the faceted transparent body 2, and a layer of lacquer 5 over the reflective layer 4. The decorative element 1 itself also has a front surface 1a and a back surface 1b. In the depicted embodiment, the front surface 1a is the same as the front surface 2a of the faceted transparent body, but it is envisaged that coatings or layers or aesthetic or protective materials may be applied. The back surface 1b of the decorative element 1 is the outermost surface of the multilayer coating 3.

In the embodiment shown in FIG. 1, the decorative element 1 is configured as a switch cover. Accordingly, in this embodiment the back surface 1b of the decorative element 1 is in contact with or in cooperative arrangement with a sensor 6, which may, for example, be a capacitive sensor. The switch cover 1 according to this embodiment of the invention forms a front cover for the sensor 6 and, therefore, provides both an actuation surface for the switch as well as a front cover which protects the sensor 6. Indeed, the decorative element 1 can be touched or otherwise handled by a user, and the contact/cooperative arrangement between the decorative element and the sensor 6 enables the transmission of a signal (i.e. actuation or deactuation of the switch).

In some embodiments (not shown), the front surface 2a of the faceted transparent body 2 may be coated, for example with a protective and/or aesthetic coating. In such embodiments, the front surface 1a of the decorative element corresponds to the outermost surface of a coating which is applied to the front surface 2a of the faceted transparent body.

Figure 2:
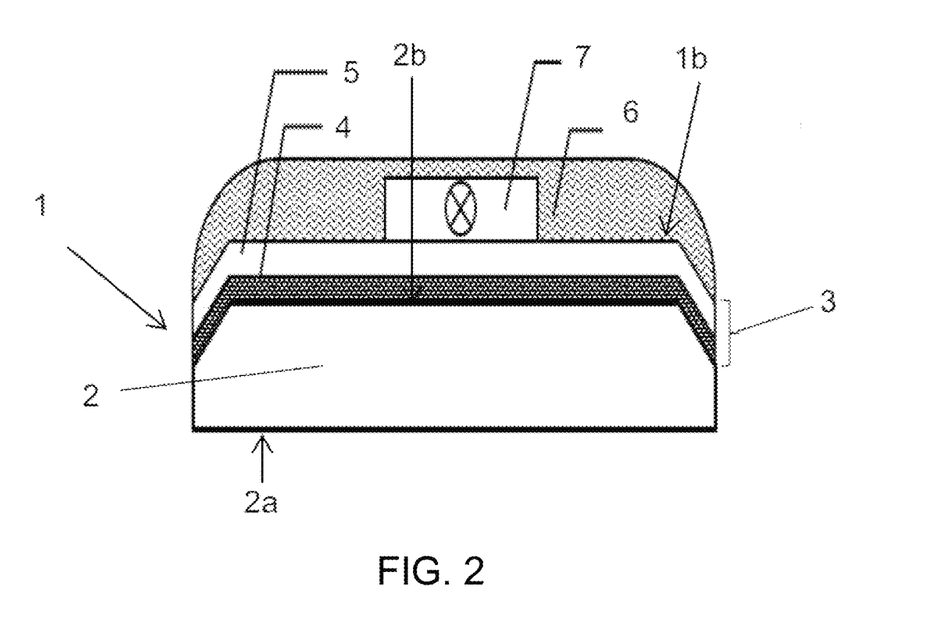
FIG. 2 is a schematic view of a decorative element according to embodiments of the invention; the decorative element is shown with a sensor and a light source located proximal to the back surface of the decorative element.

FIG. 2 is a schematic view of another embodiment of a decorative element 1 according to the invention. In this embodiment, the decorative element 1 is shown with a sensor 6 and a light source 7 located proximal to the back surface 1a of the decorative element. In the embodiment shown, the sensor 6 is in contact with the back surface 1b of the decorative element 1.

Again, in this embodiment, the decorative element 1 is configured as a switch cover. The switch cover according to the invention forms a front cover for the sensor 6 and therefore provides both an actuation surface for the switch as well as a protective cover for the sensor 6. According to this embodiment, the light source 7 is arranged to illuminate the back surface 1b of the decorative element 1 such that light is able to shine through selected regions (not shown) of the decorative element 1, the selected regions (or areas) corresponding to areas of the back surface 2b of the faceted transparent body 2 to which the reflective layer 4 or the coating 3 as a whole has not been applied. Since the multilayer coating 3 is opaque, light is only transmitted from the light source 7 to the front surface 1a of the decorative element 1 through the selected areas of the back surface 2b. The selected areas can be formed into any desired shape, pattern or symbol.

Figure 3A:
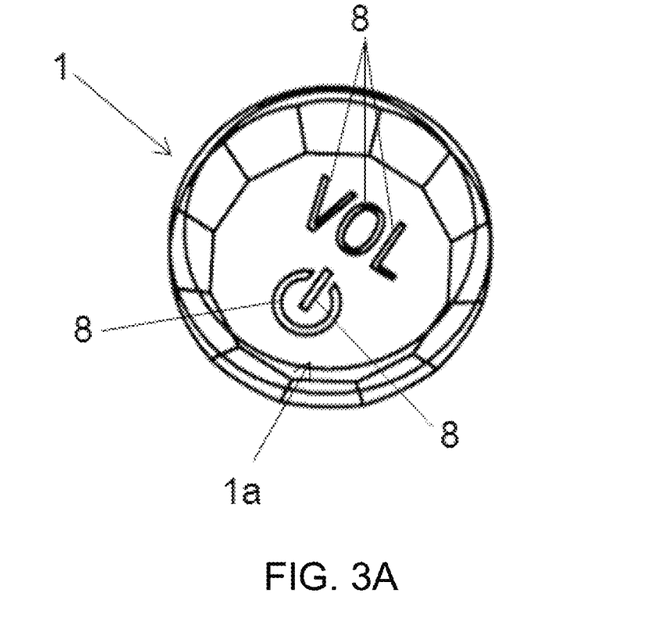
FIGS. 3A and 3B show front perspective and side views, respectively, of a decorative element according to the invention, wherein the decorative element is configured to be a cover for a switch.
Figure 3B:
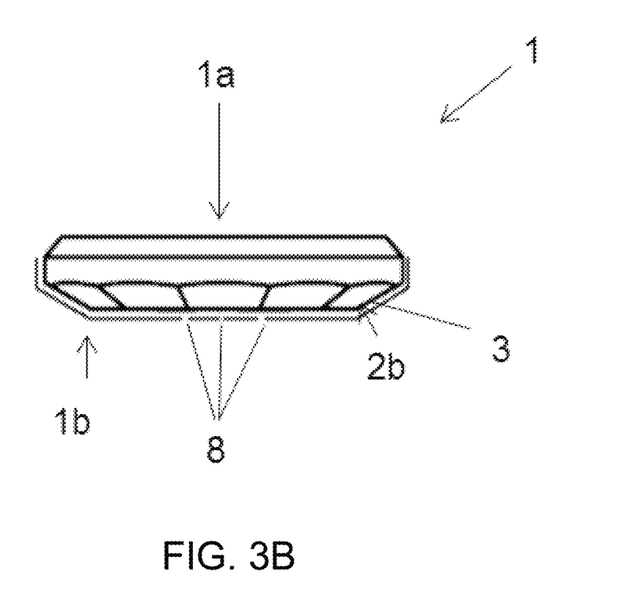

FIGS. 3A and 3B are front perspective and side views, respectively, of a decorative element 1 according to the invention, wherein the decorative element is configured to be a cover for a switch.

The decorative element 1 of FIGS. 3A and 3B is a cover for a switch, such as a touch sensitive switch, a rotary switch or a push button. The decorative element 1 has a front surface 1a and a back surface 1b. As explained in relation to FIGS. 1 and 2, the back surface 1b is the external surface of the multilayer coating 3. The decorative element 1 is opaque, i.e. the human eye cannot see through it in the regions covered by the multilayer coating 3. As such, the decorative element 1 has the ability to hide any sensors, connection or other elements that may be located behind the cover of the switch. As best seen in FIG. 3B, the back surface 2b of the faceted transparent body 2 (and correspondingly the back surface 1b of the decorative element 1) is faceted, and the front surface 1a is substantially smooth. In the depicted embodiment, as illustrated in FIG. 3A, the multilayer coating 3 is not provided over the whole back surface 2b of the transparent body 2. Instead, the opaque coating 3 is interrupted in selected areas 8, such that light is able to pass through the transparent body 2. As such, a light source (such as light source 7 shown on FIG. 2) placed behind the decorative element (i.e. proximal to the back surface 1b of the decorative element 1) is able to shine through the selected areas 8 of the decorative element 1. In the embodiment shown, the selected areas 8 are designed in the form indicia; although it is envisaged that any other desired markings or patterns may be used.

Figure 4A:
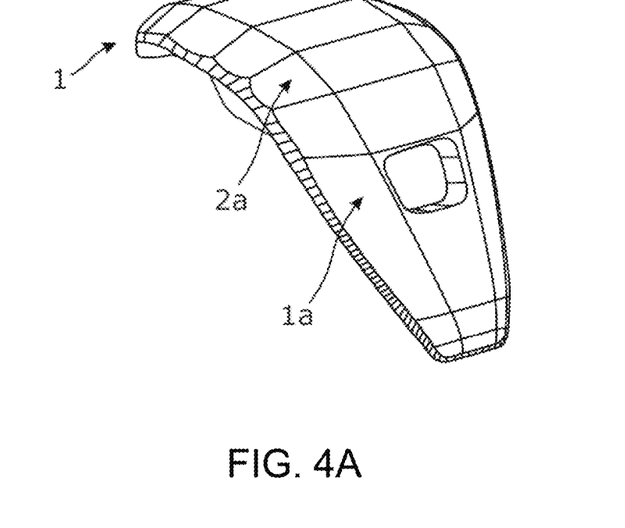
FIGS. 4A and 4B show front perspective and side views, respectively, of a decorative element according to the invention, wherein the decorative element is configured to be mounted on a gear selector switch of a vehicle.
Figure 4B:
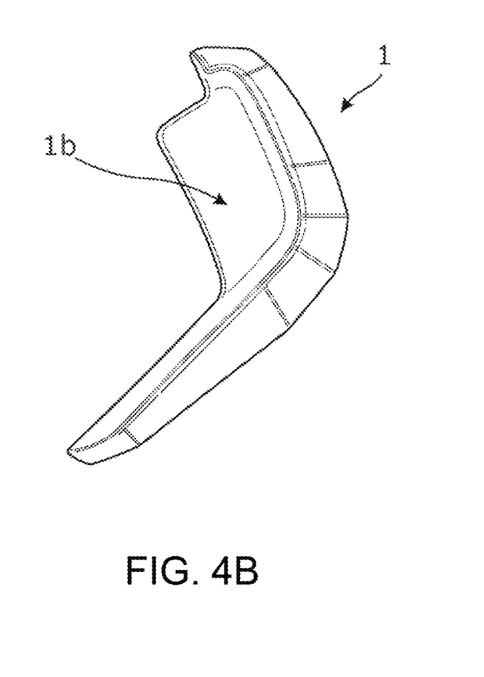

FIGS. 4A and 4B are front perspective and side views, respectively, of a decorative element 1 according to the invention, wherein the decorative element 1 is configured to be mounted on a gear selector switch. The decorative element 1 of FIGS. 4A and 4B is adapted to be a cover for a gear selector switch. The decorative element 1 has a front surface 1a and a back surface 1b. As explained in relation to FIGS. 1 and 2, the back surface 1b is the external surface of the multilayer coating 3. Due to the presence of the multilayer coating 3, the decorative element 1 is opaque, i.e. the human eye cannot see through the decorative element 1. As such, the decorative element 1 has the ability to hide any sensors, connection or other elements that may be located behind the cover of the switch. In this embodiment, as best seen on FIG. 4A, the front surface 1a of the decorative element 1 (and correspondingly the front surface 2a of the faceted transparent body 2) is faceted. As illustrated in FIG. 4B, the back surface 1b of the decorative element 1 (and correspondingly the back surface 2b of the faceted transparent body 2) has a complex geometry with a fin, the side of which is clearly visible on FIG. 4B.

Transparent Body

The term 'transparent' is used throughout this disclosure to refer to a material that has a transparency higher than zero.

The faceted transparent body can be made of a wide variety of materials, for example, glass, plastic, or cubic zirconium. However, when the decorative element is envisaged for use in combination with capacitive sensors, for example to form a cover for a spatially resolved touch sensitive switch, it is important that the material has low conductivity (e.g. dielectric or non-conductive materials, at least in the intended conditions of use of the switch are particularly suitable). As used herein, 'low conductivity' may be considered to be below about 3 S/m at 20° C., below about 2.5 S/m at 20° C., below about 2.2 S/m at 20° C. (e.g. suitable about 2.17 S/m at 20° C., such as germanium), below about 2.0 S/m at 20° C., below about 1.6 S/m at 20° C. (e.g. suitably about 1.56×10-3 S/m at 20° C.). Suitably, the conductivity of a sample (e.g. a decorative element, coating layer or transparent body) can be calculated from the Sheet Resistivity of the sample measured using the van der Pauw method, as known in the art. Transparent bodies made of glass or plastic are preferred, because they are low cost, non-conductive and are most readily provided with facets.

Decorative transparent bodies made of glass, and in particular crystal glass (e.g. as defined by the European Crystal Directive (69/493/EEC)), are particularly preferred. The invention is not limited in principle with respect to the composition of the glass. 'Glass' in this context means any frozen supercooled liquid that forms an amorphous solid. Oxidic glasses, chalcogenide glasses, metallic glasses or non-metallic glasses can be employed. Oxynitride glasses may also be suitable. The glasses may be one-component (e.g. quartz glass) or two-component (e.g. alkali borate glass) or multi-component (e.g. soda lime glass) glasses. The glass can be prepared by melting, by sol-gel processes, or by shock waves. Such methods are known to the skilled person. Inorganic glasses, especially oxidic glasses, are preferred. These include silicate glasses, soda lime glasses, borate glasses or phosphate glasses. Lead-free crystal glasses are particularly preferred.

For the preparation of the gemstones, silicate glasses are preferred. Silicate glasses have in common that their network is mainly formed by silicon dioxide ($SiO_2$). By adding further oxides, such as alumina or various alkali oxides, alumosilicate or alkali silicate glasses are formed. If phosphorus pentoxide or boron trioxide is the main network former of a glass, it is referred to as a phosphate or borate glass, respectively, whose properties can also be adjusted by adding further oxides. The mentioned glasses mainly consist of oxides, which is why they are generically referred to as oxidic glasses.

In embodiments, the faceted transparent body is made of soda lime glass, such as e.g. a soda lime glass composition as shown in Table 1 below. Suitably, the faceted transparent body may alternatively be made of lead and barium-free crystal glass. Examples of suitable lead and barium-free crystal glass compositions for use in the present invention are disclosed in EP1725502 and EP 265149, the contents of which are incorporated herein by reference, and shown in Table 1 below.

| Soda-Lime-Glass Standard | | EP 1725502 Crystal Glass | | EP 2625149 Crystal Glass | |
|---|---|---|---|---|---|
| Oxide: | wt % | Oxide: | wt % | Oxide: | wt % |
| $SiO_2$ | 72.39 | $SiO_2$ | 58.94 | $SiO_2$ | 59.13 |
| $B_2O_3$ | | $B_2O_3$ | 2.99 | $B_2O_3$ | 3.07 |
| $K_2O$ | | $K_2O$ | 1.99 | $K_2O$ | 3.49 |
| $Na_2O$ | 13.20 | $Na_2O$ | 13.45 | $Na_2O$ | 11.40 |
| $Li_2O$ | | $Li_2O$ | 2.00 | $Li_2O$ | 2.15 |
| CaO | 9.32 | CaO | 6.00 | CaO | 7.19 |
| MgO | 3.80 | MgO | 0.72 | MgO | |
| ZnO | | ZnO | 9.00 | ZnO | 7.71 |
| $Al_2O_3$ | 1.00 | $Al_2O_3$ | 0.42 | $Al_2O_3$ | 0.43 |
| $Y_2O_3$ | | $ZrO_2$ | 2.00 | $ZrO_2$ | 2.08 |
| $TiO_2$ | | $TiO_2$ | 1.99 | $TiO_2$ | 2.08 |
| $Sb_2O_3$ | | $Gd_2O_3$ | | $Gd_2O_3$ | 0.10 |
| $P_2O_5$ | | $P_2O_5$ | | $P_2O_5$ | 0.70 |
| $Sb_2O_3$ | | $Sb_2O_3$ | 0.50 | $Sb_2O_3$ | 0.47 |
| $SO_3$ | 0.29 | | | | |
| Total | 100.00 | Total | 100.00 | Total | 100.00 |

As another raw material for the preparation of the faceted transparent body, plastics can be employed. Transparent plastics are preferred. Among others, the following materials are suitable:

acrylic glass (polymethyl methacrylates, PMMA),
polycarbonate (PC),
polyvinyl chloride (PVC),
polystyrene (PS),
polyphenylene ether (PPO),
polyethylene (PE),
poly-N-methylmethacrylimide (PMMI).

The advantages of the plastics over glass reside, in particular, in the lower specific weight, which is only about half that of glass. Other material properties may also be selectively adjusted. In addition, plastics are often more readily processed as compared to glass. Drawbacks include the low modulus of elasticity and the low surface hardness as well as the massive drop in strength at temperatures from about 70° C., as compared to glass. A preferred plastic is poly-N-methylmethacrylimide, which is sold, for example, by Evonik under the name Pleximid® TT70. Pleximid® TT70 has a refractive index of 1.54, and a transmittance of 91% as measured according to ISO 13468-2 using D65 standard light.

The geometric design of the faceted transparent body 2 is not limited in principle and predominantly depends on design aspects. The type of faceting is closely related to the geometry of the faceted transparent element, and to the desired aesthetics of the decorative element and article in which it is incorporated. In principle, the geometric shape of the facets is not limited. For example, rectangular, square or triangular facets may be used.

If the decorative element 1 of the invention is configured as a switch cover, the transparent body will preferably be of a geometry such that the decorative element adequately covers the desired area and can be coupled to the other elements of the switch.

In some embodiments, for example, for use in conjunction with touch-sensitive control elements, the faceted transparent body 2 is of a geometry and/or thickness suitable for efficient operation of touch sensitive controls. For example, in some embodiments, the maximum thickness of the decorative element 1 (i.e. the maximum thickness of the coated faceted transparent body 2) does not exceed about 10 mm. The maximum thickness of the decorative element 1 is the maximum distance between the front surface 1a of the decorative element 1 and the back surface 1b of the decorative element 1. In other words, the maximum thickness of the decorative element 1 is the maximum of the sum of the distance between the front surface 2a of the faceted transparent body 2 (or the outer surface of a coating applied thereon, where present) and the external surface of the multilayer coating 3 applied to the back surface 2b of the transparent body 2 at the corresponding location on the back surface of the faceted transparent body 2. Due to the complex geometry of the decorative element 1, the thickness of the decorative element 1 may vary depending on the region of the decorative element 1. Particularly (but not necessarily only) in cases where the decorative element 1 is to be combined with a capacitive sensor for a touch sensitive switch, the use of a thin decorative element 1 may contribute to ensuring that the presence of the decorative element does not hinder the functioning of the sensor.

In embodiments, the decorative element 1 has a variable thickness of up to 12 mm or up to 10 mm, such as between approximately 3 and 10 mm, and suitably between approximately 4 and 8 mm. Such embodiments are particularly useful for use in combination with touch sensors, such as capacitive sensors. Thus, in embodiments, the maximum thickness of the decorative element is about 10 mm, about 8 mm, about 6 mm or about 4 mm.

Multilayer Coating

Applying reflective coatings using techniques such as physical vapor deposition (PVD) on surfaces of complex geometry, such as the back surfaces 2b of the faceted transparent bodies illustrated in FIGS. 3 and 4 is difficult because the complex geometry causes an uneven thickness in the deposited reflective layer. In the case of dielectric reflective layers, a precisely controlled thickness is essential to the reflective properties of the coating. As such, when dielectric reflective coatings are applied to the surface of a transparent body with a complex geometry, in accordance with the prior art, the resulting reflection is uneven.

Against this background, the present inventors have surprisingly discovered that a reflective layer 4 of semiconductor material according to the invention having a thickness of at least about 400 nm results in a uniformly reflective coating despite variations in the thickness of the coating across the faceted transparent body. In particular, the reflective layer 4 according to the invention is such that there are no areas where the thickness of the reflective layer 4 is substantially below 250 nm or, in some embodiments, substantially below 400 nm. In advantageous embodiments, the reflective layer 4 according to the invention is such that there are no areas where the thickness of the reflective layer 4 is substantially below 500 nm.

The inventors have discovered that when the semiconductor material is silicon or comprises silicon as a major component, the thickness of the reflective layer can as low as about 400 nm while still resulting in a uniformly reflective coating despite variations in the thickness of the coating across the faceted transparent body. In embodiments, a reflective layer 4 of semiconductor material according to the invention may comprise at least about 50 wt % Si, and may be such that there are no areas where the thickness of the reflective layer 4 is substantially below 400 nm. In some such embodiments, the reflective layer 4 may comprise at least about 70 wt % Si, at least about 90 wt % Si, at least about 95 wt % Si or may consist of Si.

On the other hand, the inventors have discovered that when the semiconductor material is germanium or comprises germanium as a major component, the thickness of the reflective layer can as low as about 250 nm while still resulting in a uniformly reflective coating despite variations in the thickness of the coating across the faceted transparent body. In embodiments, a reflective layer 4 of semiconductor material according to the invention may comprise at least about 50 wt % Ge, and may be such that there are no areas where the thickness of the reflective layer 4 is substantially below 250 nm. In some such embodiments, the reflective layer 4 may comprise at least about 70 wt % Ge, at least about 90 wt % Ge, at least about 95 wt % or may consist of Ge.

The thickness of a reflective layer 4 according to the invention may be measured by profilometery, as known in the art. For example, the thickness of a reflective layer 4 applied on a faceted transparent body 2 according to the invention may be measured by applying a section of adhesive tape on a chosen area of the reflective layer 4, removing the adhesive tape and reflective coating 4 adhered to the tape, and measuring the height of the 'step' (i.e. difference in height between the uncoated area and the adjacent coated areas). As the skilled person would understand, the variations in thickness of the reflective layer 4 will largely depend on the topology of the underlying faceted transparent body 2. As such, the number and precise location of measurement points that are appropriate in order to ensure that the thickness of a reflective layer 4 satisfies the requirement of having the minimum thickness according to the invention will vary depending on the topology of the faceted transparent body 2.

According to the invention, the reflective layer 4 is part of a multilayer coating 3, comprising a lacquer layer 5 over the reflective layer 4 so as to protect the reflective layer from damage, which might affect the integrity of the reflective layer 4 and reduce its depth, in parts, to less than 400 nm (or 250 nm, as the case may be).

Typically, the reflective layer is deposited by any suitable physical vapour deposition method. For example, the reflective layer may be applied by sputtering, for example, magnetron sputtering. High vacuum magnetron sputtering using dc and medium-frequency technology (for example, using a Leybold dynamet 3h apparatus) is particularly convenient, but any magnetron sputtering technique is expected to be suitable. Methods of applying semiconductor metallic films onto e.g. glass are known in the art and will not be discussed further.

As the semiconductor material, silicon (Si) and germanium (Ge) are preferred; although other semiconductor materials may be used. Additionally, mixtures of semiconductor materials or even doped semiconductors may be used. As such, the use of the wording 'semiconductor material' throughout the disclosure is not intended to encompass only materials that are semiconductors but encompasses mixtures comprising primarily one or more semiconductor materials, preferably chosen from silicon (Si) and germanium (Ge), and other materials in smaller amounts, such as, for example, aluminium (Al). When other materials are used, care must be taken to ensure that they show low conductivity at room temperature (or at the temperature at which the article incorporating the decorative element is intended to be used), at least if the decorative element is envisaged for use with a capacitive sensor. Within the context of the disclosure, a material is considered to have low conductivity if its conductivity at room temperature is similar to or less than that of silicon (about $1.56 \times 10^{-3}$ S/m at 20° C.) or germanium (about 2.17 S/m at 20° C.), or lower. In some embodiments, the reflective layer consists of Si or Ge. Silicon is a particularly preferred material for use as the semiconductor material of the reflective layer. In embodiments, a material is considered to have low conductivity if its conductivity at room temperature is similar to that of Silicon doped with up to about 5 wt % of Al.

In embodiments, the reflective layer 4 may comprise, in addition to the semiconductor material such as Si or Ge, small amounts of one or more metals. For example, the inventors have found that aluminium (Al) could be combined with Si or Ge without altering the properties of the reflective layer at least with respect to the stability of the reflection profile in the visible range, as well as with respect to its compatibility with spatially resolved touch sensitive switches. In embodiments, an amount of another metal, for example Al, up to 5 wt % may be included in the reflective layer without detriment to the stability of the reflection profile in the visible range, or the compatibility with spatially resolved touch sensitive switches. In embodiments, the reflective layer may comprise one or more semiconductor materials such as Si, Ge or combinations thereof, and about 1 wt % of another metal, about 2 wt % of another metal, about 3 wt % of another metal, about 4 wt % of another metal, or about 5 wt % of another metal.

The choice of materials used in the reflective layer 4 may influence the colour of the coating. As such, depending on the intended use of the decorative element 1 as well as the preferences of the user, the composition of the reflective layer 4 may be modified, both with respect to its primary semiconductor elements and doped elements, in order to obtain a desired appearance while maintaining the benefits of the invention. Accordingly, the choice of low-conductivity or semiconductor material may be based on aesthetics, i.e. the desirable reflection of the faceted transparent body 2; or may be due to other considerations. In some preferred applications, therefore, the semiconductor material comprises Si, and the coating comprising a major component of Si at a thickness of at least about 400 nm.

In embodiments, the reflective layer comprises more than one individual layer of non-conductive material, at least one of which is a layer of Si or Ge.

The use of a semiconductor material is particularly important in embodiments where the decorative element is configured for use as a switch cover for a capacitive touch sensitive switch. Indeed, in any embodiments in which the decorative element is envisaged for use with a capacitive sensor, the decorative element (including both the transparent faceted body and the coating) must be non-conductive in order to avoid interfering with the operation of the capacitive sensor.

As shown in the examples below, the inventors have discovered that the reflective layer according to the invention shows uniform light reflection even in the presence of variations in the thickness of the reflective layer across the surface of the transparent body, and is opaque when combined with a layer of lacquer.

In particular, the reflective layer according to the invention is such that the visible light reflection spectrum of the reflective layer does not substantially change depending on the thickness of the reflective layer above approx. 250 nm or 400 nm. However, the necessary minimum thickness of the reflective layer may be dependent on the choice of low conductivity material for use in the coating. In particular, the reflection spectrum (in % reflected light as a function of wavelength) between 350 and 650 nm may be substantially identical regardless of the thickness of the reflective layer, provided that the reflective layer does not have any regions where the thickness of the layer is substantially below 400 nm in the case of a reflective layer comprising a major part of Si. Within the context of the invention, the reflection spectrum between 350 nm and 650 nm may be substantially identical in the sense that, provided that the reflective layer does not have any regions where the thickness of the layer is substantially below 400 nm (or below 250 nm), no differences in colour of the layer will be detectable with the naked eye despite the presence of variations in the thickness of the layer. Preferably, when the reflective layer comprises Si as the major component, the reflective layer according to the invention does not have any regions where the thickness of the layer is substantially below 500 nm. In such embodiments, the reflection spectrum between 350 and 650 nm may be substantially identical regardless of the thickness of the reflective layer in the sense that no substantial variation of the reflection spectrum (in % reflected light as a function of wavelength) will be detectable with an apparatus such as a spectrometer when the thickness of the layer is varied.

In embodiments where the reflective layer comprises Ge as a main component, the reflective layer according to the invention is such that the visible light reflection spectrum of the reflective layer does not substantially change depending on the thickness of the reflective layer above approx. 250 nm. In such embodiments, the reflection spectrum (in % reflected light as a function of wavelength) between 350 and 750 nm may be substantially identical regardless of the thickness of the reflective layer, provided that the reflective layer does not have any regions where the thickness of the layer is substantially below 250 nm. Within the context of the invention, the reflection spectrum between 350 nm and 750 nm may be substantially identical in the sense that, provided that the reflective layer comprising Ge does not have any regions where the thickness of the layer is substantially below 250 nm, no differences in colour of the layer will be detectable with the naked eye despite the presence of variations in the thickness of the layer.

In embodiments wherein Si is the major component of the reflective layer, the reflective layer has a thickness of at least about 500 nm, at least about 550 nm, at least about 600 nm, at least about 700 nm, at least about 800 nm, at least about 900 nm, or at least about 1,000 nm. Typically, in the case of a coating on a transparent body having a complex geometry, the thickness of the reflective layer may vary across the surface of the reflective layer on the transparent body, but at no point is the reflective layer thickness substantially below about 500 nm, substantially below about 550 nm, substantially below about 600 nm, substantially below about 700 nm, or substantially below about 800 nm.

Although thicker reflective layers than those preferred embodiments disclosed herein are technically possible and may not show variations in colour due to the thickness of the layer, the deposition time required to apply the reflective layer and the amount of material required will increase with the thickness of the layer, and very large thicknesses may cause additional problems such as stress on the other materials of the decorative element. As such, the reflective layer preferably has a thickness that does not substantially exceed 5,000 nm. In embodiments, the reflective layer has a thickness of at most about 2,000 nm, at most about 1,500 nm, at most about 1,200 nm, at most about 1,000 nm, or at most about 800 nm.

Accordingly, in embodiments, the reflective layer has a thickness of between about 250 nm and 1,500 nm, between about 400 nm and 1,500 nm, between about 400 nm and 1,200 nm, between about 400 nm and 1,000 nm, between about 500 nm and 1,000 nm, or between about 500 nm and 800 nm.

The layer of lacquer primarily serves as a protective layer. In particular, the layer of lacquer protects the reflective layer from mechanical or chemical damage and helps to preserve the desired minimum thickness of 500 nm. Advantageously, the layer of lacquer may contribute to the opacity of the coating. As such, the layer of lacquer may be chosen such that the combination of the reflective layer and the layer of lacquer forms a multilayer coating that is uniformly opaque, wherein this property is assessed as explained below.

In embodiments, the layer of lacquer may be pigmented. Pigmented lacquers may be particularly useful where complete opacity of the multilayer coating is desirable. On the other hand, non-pigmented lacquers may have slightly better resistance properties. Further, better opacity properties can be obtained by using reflective layers that are thicker than the minimum requirement of 250 nm or 400 nm for uniform colour. As such, the choice of a lacquer may depend on the aesthetic and functional properties that are desired for the object, as well as balancing considerations of costs and availability of the materials.

Preferably, the lacquer used in the layer is selected so as to be chemically and mechanically robust. A lacquer is considered to be mechanically and chemically robust if it would not substantially degrade or allow degradation of the underlying reflective layer of a multilayer coating in the conditions that would be expected in the intended use. Thus, as the skilled person would appreciate, the choice of a particular lacquer may depend on the intended conditions of use of the decorative element. For example, depending on the intended use it may be advantageous for the multilayer coating to be highly resistant to sweat, corrosion and/or climate exposure. As the skilled person would appreciate, tests are available to ensure that a chosen lacquer results in a multilayer coating that satisfies the requirements of the product in which the decorative element is intended to be incorporated. For example, an anti-corrosion salt spray test may be used to test resistance to corrosion. In general, a multilayer coating may be considered to be resistant to a particular condition when the decorative element comprising the coating does not show significant visible degradation when repeatedly exposed to the said conditions in a laboratory setting. In particular, within the context of this disclosure, high resistance may be interpreted to mean that the multilayer coating shows no significant alteration when exposed to one or more, and preferably all, of the following tests: temperature change test according to DIN 9022-2, sulfur dioxide (corrosion) test according to DIN 50018-KFW 0,2 S, environmental test according to DIN ISO 9022-2 (cold, heat and humidity) and salt spray test according to DIN EN 60068-2-11 Ka.

The lacquer may additionally ensure that the decorative element according to the invention is bondable. As the skilled person would understand, the choice of a suitable lacquer may depend on the material to which the decorative element is intended to be bonded, and/or on the adhesive that is intended to be used.

In convenient embodiments, the layer of lacquer comprises a lacquer selected from the group consisting of: epoxy lacquers, one component polyurethane lacquers, bi-component polyurethane lacquers, acrylic lacquers, UV-curable lacquers, and sol-gel coatings. Preferably, the lacquer is a polyurethane lacquer, such as a bi-component polyurethane lacquer.

The layer of lacquer may be applied using any two-dimensional application method known in the art. For example, the layer of lacquer may be applied by spraying, digital printing, rolling, or curtain coating.

In embodiments, the lacquer may be applied with a thickness of about 9 μm. In embodiments, the lacquer may be applied with a thickness of between about 4 and 14 μm (i.e. 9±5 μm).

Opacity

The multilayer coating of the invention forms an opaque layer over the back surface of a decorative body. In selected points or regions of the decorative body, however, the multilayer coating may be deliberately absent or removed so as to provide points or regions of a decorative element of the invention that remain transparent or translucent.

Throughout this disclosure, the term 'opaque' is used to refer to the property of a coating which does not allow a substantial amount of visible light to travel from one side of the coating to the other, i.e. the coating is substantially impermeable to (visible) light. A 'substantial amount of visible light' is an amount that can be detected by the human eye. In advantageous embodiments, a coating is referred to as 'opaque' where the coating is impermeable to light up to about 5,000 $cd/m^2$, or up to about 10,000 $cd/m^2$. Light transmission can be tested by any appropriate method. For example, such as property can be tested by placing a light of the required intensity on one side of the coating in a dark environment, and verifying whether the human eye can detect any light at a specific distance (e.g. 30 cm) from the opposite side of the coating. As the skilled person would understand, at very high light intensity, such as e.g. 50,000 $cd/m^2$, pinholes may be visible in the coating, but these would not be visible to the human eye in normal conditions of use of the invention.

As explained above, the reflective layer and optionally the lacquer layer may be applied on areas of the back surface of the transparent faceted body, so as to leave some areas uncoated. In embodiments this may be achieved by applying the multilayer coating or the reflective layer 4 only over the whole back surface 2a of the transparent faceted body, and then selectively removing the coating in some areas. In embodiments, a photolithography technique may be used to selectively etch areas of the coating. Alternatively, a laser may be used to selectively remove areas of the coating. This may be particularly convenient due to the flexibility and simplicity of the process. In other embodiments, this may be achieved by masking or shadowing the selected areas that are not to be coated during the coating process.

Advantageously, the presence of the multilayer coating in some areas but not others results in a decorative element which is opaque in areas and transparent in other areas, as desired. As such, a source of light placed behind the decorative element may be able to shine through the decorative element in selected areas. This is particularly useful when the decorative element is configured as a switch cover as it enables the inclusion of indicia in the switch cover, for example, informing the user of what the switch controls.

Sensors and Switches

As mentioned above, the decorative elements of the invention are particularly suited for use as covers for switches or other control elements. There is no limitation to the type of switches in which the decorative elements of the invention may be used. Many different types of electronic sensors may be used in combination with the decorative element according to the invention configured as a switch cover. In particular, pressure sensors, simple physical switches, or even touch sensors may be used.

Capacitive touch sensors may be used as the electronic sensors in combination with the decorative element configured as a switch cover in accordance with the invention. Capacitive sensors include an electronic component with a capacitor and an input interface. Upon touching the input interface with a finger or an electrically conductive stylus, the capacitor changes its capacitance. This change is detected electronically and processed by means of further electronic control elements. The change in capacitance is detected by the sensor, and this change may be processed by electronic control elements. When the decorative element according to the invention is used in combination with a conventional capacitive sensor to which the decorative element is physically connected, the presence of the decorative element preferably does not hinder the transmission of signal to the input interface. This may be achieved by maintaining a low thickness of the decorative element (as discussed above), and by ensuring that none of the components of the decorative element are conductive.

The decorative elements according to the invention are particularly advantageous when combined with capacitive sensors, to make touch switches, and in particular to make spatially resolved touch sensitive switches (i.e. where various touch zones on the switch must be distinguishable despite the presence of a cover). Capacitive sensors have a low power input, and typically they do not wear in use (in contrast to a physical switch). Additionally, when combined with the switch cover of the invention, the switch is easy to clean, resistant to humidity and insensitive to temperature variations. Additionally, touch sensitive switches are extremely versatile in terms of the elements that they can control.

The decorative elements according to the invention are particularly suitable for use as switch covers in the context of high-end vehicles, for example, cars, yachts, jet planes, where a perfect uniformity or light reflection as well as the aesthetic potential afforded by the use of a faceted transparent body are important.

Other variations of the invention will be apparent to the skilled person without departing from the scope of the appended claims.

EXAMPLES

Example 1

In this example, the reflection spectrum of silicon layers having different thicknesses (between 300 nm and 1,200 nm) and germanium layers having different thicknesses (between 250 nm and 500 nm) was tested for light of wavelengths between 350 and 750 nm.

Figure 5A:
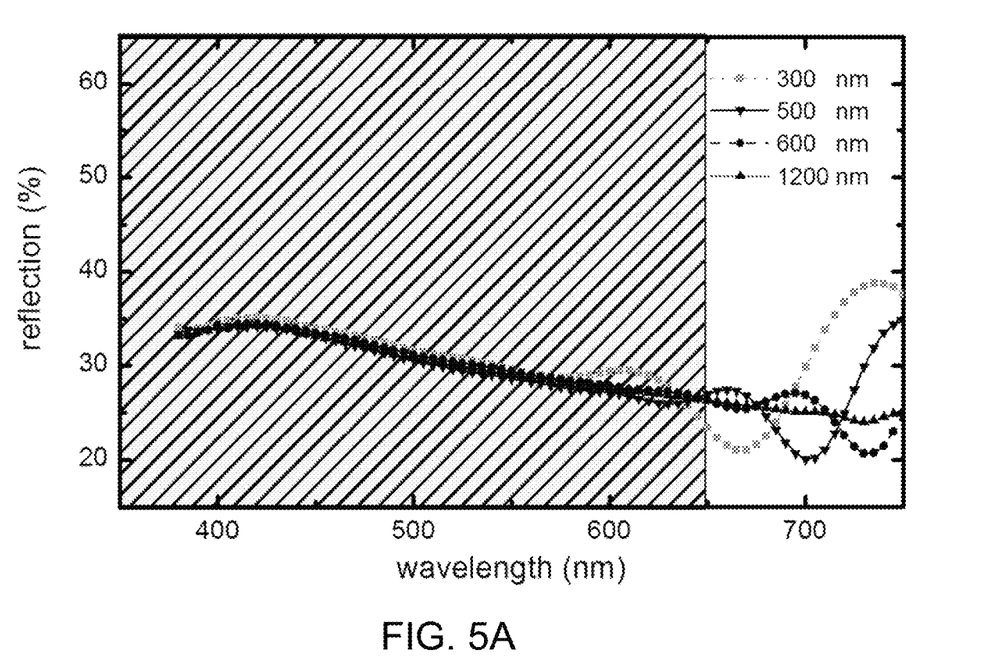
FIGS. 5A and 5B are graphs showing the percentage of light within the wavelength range of approx. 350 nm to 750 nm that is reflected by a layer of semiconductor material, according to the thickness of the semiconductor material layer; wherein the semiconductor material is Si with a thickness of between 300 nm and 1200 nm (FIG. 5A), and wherein the semiconductor material is Ge with a thickness of between 250 nm and 500 nm.
Figure 5B:
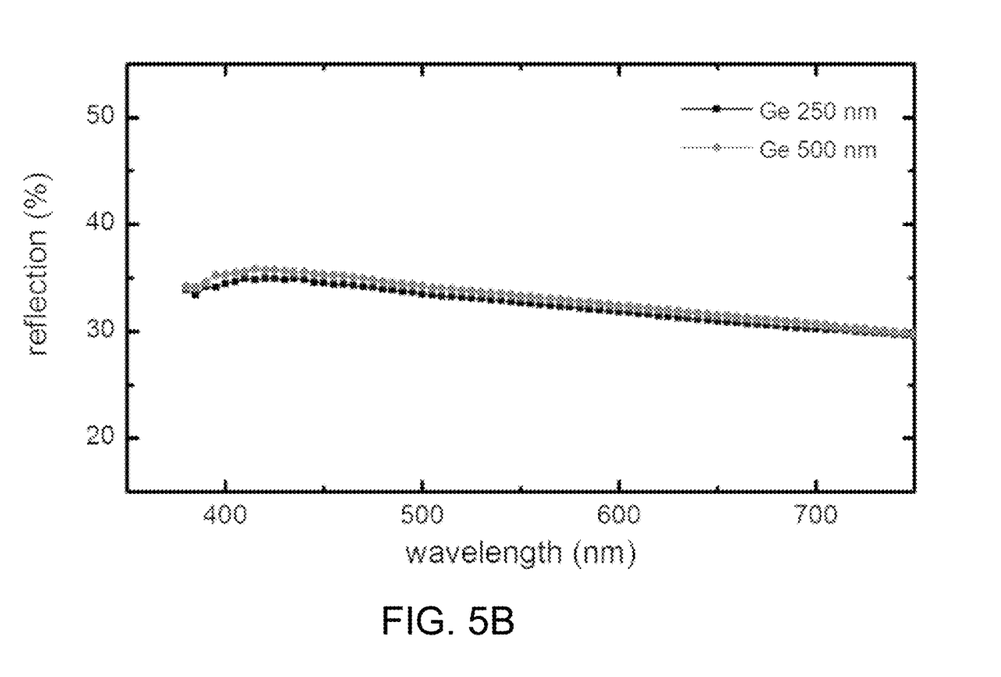

The results of these analyses are illustrated in FIGS. 5A and 5B. FIG. 5A shows that in the wavelength range between 350 to 650 nm, encompassing most of the visible light range (see dashed area) no significant variations among the spectra could be measured using a spectrometer for silicon coating thicknesses of about 500 nm and higher. However, a decrease of the thickness of the coating substantially below 500 nm, as shown for 300 nm, results in a change of the spectra compared to that for coating layers of 500 nm and above. Further, the data shows that the variations among the spectra for silicon coating thicknesses of about 400 nm and higher is small enough that any potential variation in colour would not be visible to the human eye.

Therefore, in accordance with the invention, for film thicknesses greater than or equal to 400 nm, the Si layer does not show any visible changes in its visible light (i.e. 350 nm to 650 nm) reflective properties and, hence, in its colour due to thickness variations.

FIG. 5A shows that in the wavelength range between 350 to 750 nm, encompassing all of the visible light range, no significant variations among the spectra could be measured using a spectrometer for germanium coating thicknesses of about 250 nm and higher. Therefore, in accordance with the invention, for coatings comprising germanium as a main component, the thickness of the layer can be as low as 250 nm without showing significant changes in its visible light (i.e. 350 nm to 750 nm) reflective properties and, hence, in its colour due to thickness variations.

As explained above, this consistent reflective property makes it possible to achieve the same desirable colour of the decorative element despite the different geometries of the transparent body of the decorative element, which may result in different coating layer thicknesses.

Results are shown in FIGS. 5A and 5B for a facetted transparent body of a lead and barium-free crystal glass according to EP 1725502 (see Table 1 above). Similar results are obtained using different glass substrates, such as soda lime glass standard and crystal glass according to EP 2625149, as exemplified in Table 1 above.

Example 2

An exemplary decorative element according to the invention was prepared. In particular, a crystal faceted component was coated with a layer of Si using magnetron sputtering (high-vacuum dc and medium-frequency magnetron sputtering using a Leybold dynamet 3h). A layer of bi-component polyurethane lacquer was applied onto the Si layer by spraying.

The thickness of the resulting multilayer coating was then measured at a number of different points on the decorative element. In particular, the thickness of the coating was measured at points that were expected to have the smallest or varying thickness, based on the geometry of the faceted component, e.g. facet surfaces where the distance between the deposition source and the surface changes.

Figure 6A:
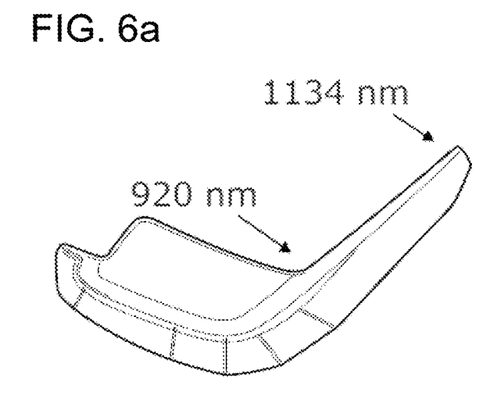
Figure 6B:
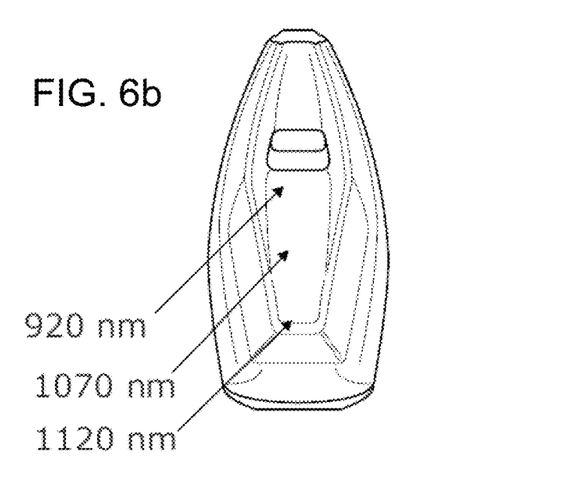

FIGS. 6A and 6B are schematic representations of the decorative element that was made. In this example, the decorative element is configured to be mounted on a gear selector switch for a vehicle.

Figure 6C:
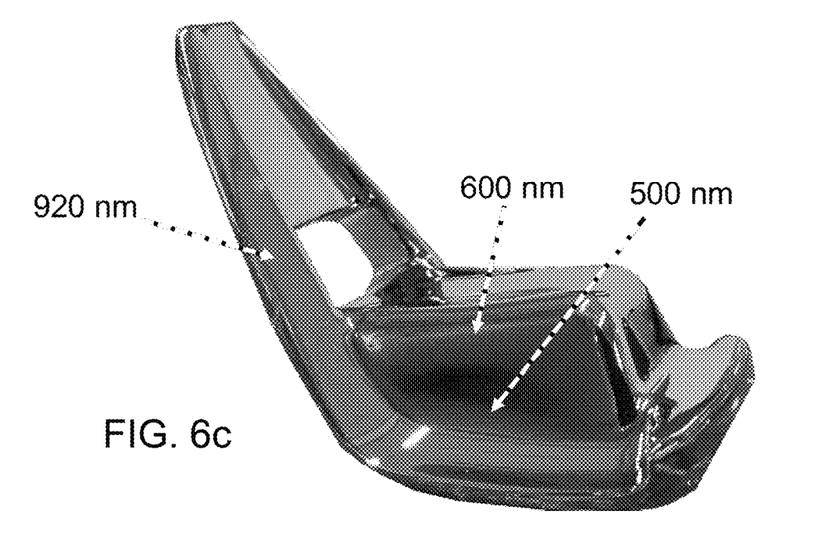
FIG. 6C is a photo of the decorative element shown schematically in FIGS. 6A and 6B, which demonstrates that the decorative element has a uniform opaque coating despite the variable thickness of the coating.

FIG. 6C is a photo of the decorative element shown schematically on FIGS. 6A and 6B. In this example, as can be seen, the decorative element according to the invention has a uniform opaque coating despite the varying thickness of the coating.

The decorative element of FIG. 6C was additionally tested for opacity (data not shown). A light of about 10,000 cd/m² was placed adjacent the back of the decorative element, in a dark room, and the visibility of this light by a human eye located 30 cm away from the front surface of the decorative element was tested. The experiment demonstrated that the combination of the reflective layer and the lacquer layer resulted in an opaque coating across the entire surface of the decorative element despite its complex geometry.

Additionally, the switch cover of FIG. 6C was tested for resistance to corrosion (anti-corrosion salt spray test), sweat and climate. The tests showed that the lacquer provided sufficient protection to the reflective coating such that the optical properties of the coating were unaltered over the duration of the test.

This example demonstrated that a coating according to the invention ensures a uniform colour and opacity even when applied to a transparent faceted body of complex geometry.

Example 3

Figure 7:
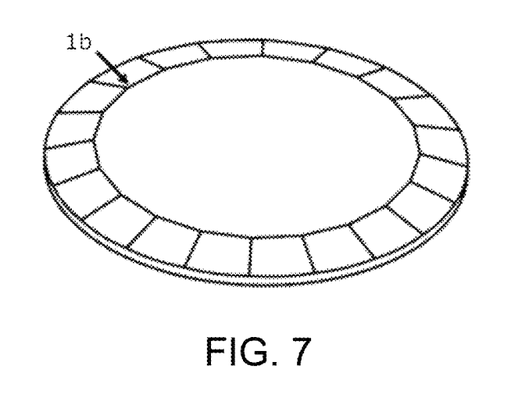
FIG. 7 is a back perspective view of an example of a decorative element according to the invention, which was used to test compatibility with touch sensitive switches.

A decorative element according to the invention with a geometry as shown on FIG. 7 was prepared. The transparent faceted body was a round crystal with a diameter of about 50.3 mm and a thickness of about 3 mm. In this example, the back surface of the crystal was faceted.

The crystal component was coated with a layer of Si using magnetron sputtering (high-vacuum dc and medium-frequency magnetron sputtering using a Leybold dynamet 3h), resulting in a layer of Si having an average thickness of about 800 nm. The average thickness of the Si layer was determined by measuring the thickness of the layer as described above, at a number of different points that are expected to show variations of thickness. For example, the thickness of the Si layer on a relatively flat surface is expected to be more or less constant, whereas e.g. edges of facets may have a different thickness which can be measured separately. A layer of bi-component polyurethane lacquer (Hesse DB 45245) with a thickness of about 9,000 nm was then applied onto the Si layer by spraying.

The potential for use of this decorative element in combination with a touch sensitive sensor was tested. The coated crystal was placed directly on a touchpad development board (Microchip DM160227), and several locations on the crystal were touched. The results showed that the crystal had only a negligible influence on adjacent electrodes, and thus the specific positions where the crystal was touched could be reliably detected by the electronics of the sensor.

The opacity of the decorative element was also tested by back-lighting the sample with a light source of about 10,000 cd/m² (as explained above). The data (not shown) demonstrated that the coating was opaque as assessed by the human eye.

The invention claimed is:

1. A decorative element comprising a faceted transparent body having a front surface and a back surface, and a coating on at least part of the back surface of the faceted transparent body, wherein the coating comprises a reflective layer of semiconductor material and a layer of lacquer over the reflective layer, wherein the reflective layer of semiconductor material has a non-uniform thickness and wherein the reflective layer of semiconductor material has a thickness of at least about 250 nm such that a visible light reflection spectrum of the reflective layer does not substantially change depending on the thickness of the reflective layer.

2. The decorative element of claim 1, wherein the faceted transparent body is a transparent plastic body, a cubic zirconia body, or a glass body.

3. The decorative element of claim 1, wherein the coating is impermeable to light up to about 10,000 cd/m2.

4. The decorative element of claim 1, wherein the decorative element has: (i) a maximum thickness of about 12 mm or (ii) a thickness of between 3 mm and 12 mm.

5. The decorative element of claim 1, wherein the thickness of the reflective layer is at least 400 nm.

6. The decorative element of claim 1, wherein the thickness of the reflective layer is at most 2,000 nm.

7. The decorative element of claim 1, wherein the faceted transparent body comprises a non-planar back surface.

8. The decorative element of claim 7, wherein the back surface of the faceted transparent body comprises facets.

9. The decorative element of claim 1, wherein the reflective layer comprises silicon or germanium.

10. The decorative element of claim 9, wherein the reflective layer consists of silicon or germanium.

11. The decorative element of claim 1, wherein the reflective layer has low conductivity at room temperature, the faceted transparent body is made of one or more materials with low conductivity, or both.

12. The decorative element of claim 11, wherein the low conductivity is less than about 3 S/m at 20° C.

13. The decorative element of claim 1, wherein the layer of lacquer comprises a lacquer selected from the group consisting of: epoxy lacquers, one component polyurethane lacquers, bi-component polyurethane lacquers, acrylic lacquers, UV-curable lacquers, and sol-gel coatings.

14. The decorative element of claim 13, wherein the lacquer is pigmented.

15. A switch cover for a switch or control element, comprising a decorative element, wherein the decorative element comprises a faceted transparent body having a front surface and a back surface, and a coating on at least part of the back surface of the faceted transparent body, wherein the coating comprises a reflective layer of semiconductor material and a layer of lacquer over the reflective layer, wherein the reflective layer of semiconductor material has a non-uniform thickness and wherein the reflective layer of semiconductor material has a thickness of at least about 250 nm such that a visible light reflection spectrum of the reflective layer does not substantially change depending on the thickness of the reflective layer; and wherein, in use, the back surface of the faceted transparent body is a back surface of the switch cover and the front surface provides an operator input surface of the switch.

16. The switch cover of claim 15, wherein a part of the back surface of the faceted transparent body is not covered by the reflective layer, such that a light source placed adjacent the back surface of the faceted transparent body is visible from a side of the decorative element opposite the back surface in selected areas corresponding to the part of the back surface of the faceted transparent body that is not coated with the reflective layer.

17. A switch comprising a sensor for detecting actuation of the switch and a cover protecting the sensor and comprising a decorative element, wherein the decorative element comprises a faceted transparent body having a front surface and a back surface, and a coating on at least part of the back surface of the faceted transparent body, wherein the coating comprises a reflective layer of semiconductor material and a layer of lacquer over the reflective layer, wherein the reflective layer of semiconductor material has a non-uniform thickness and wherein the reflective layer of semiconductor material has a thickness of at least about 250 nm such that a visible light reflection spectrum of the reflective layer does not substantially change depending on the thickness of the reflective layer, and wherein the decorative element is assembled in the switch such that the faceted transparent body forms an external, actuating surface of the switch and the back surface of the faceted transparent body is internal to the switch as assembled.

18. The switch of claim 17, wherein the sensor is a pressure sensor, or wherein the sensor is a capacitive sensor and the switch is a touch sensitive switch.

19. The switch of claim 18, wherein the switch comprises a light source located behind the decorative element, wherein the coating on the back surface of the faceted transparent body covers part of the back surface of the faceted transparent body such that the light source placed behind the decorative element is visible from a side of the decorative element opposite the back surface in selected areas corresponding to areas of the back surface of the faceted transparent body that are not coated with the reflective layer.

* * * * *